(12) United States Patent
Pfannenberg

(10) Patent No.: US 6,755,045 B2
(45) Date of Patent: Jun. 29, 2004

(54) AIR CONDITIONING SYSTEM, IN PARTICULAR FOR SWITCH CUPBOARDS

(75) Inventor: Andreas Pfannenberg, Hamburg (DE)

(73) Assignee: Pfannenberg GmbH, Hamburg (DE)

( * ) Notice: Subject to any disclaimer, the term of this patent is extended or adjusted under 35 U.S.C. 154(b) by 0 days.

(21) Appl. No.: 10/200,004

(22) Filed: Jul. 19, 2002

(65) Prior Publication Data
US 2003/0217562 A1 Nov. 27, 2003

(30) Foreign Application Priority Data
May 27, 2002 (EP) .............................................. 02011735

(51) Int. Cl.$^7$ ........................... F25B 47/00; F25D 23/12
(52) U.S. Cl. ........................... 62/279; 62/259.2; 62/305
(58) Field of Search .............................. 62/259.2, 305, 62/279, 298

(56) References Cited

U.S. PATENT DOCUMENTS

| 4,424,686 A | * | 1/1984 | Lapeyre et al. ............. 62/259.1 |
| 4,938,035 A | * | 7/1990 | Dinh ............................ 62/279 |
| 5,036,677 A | | 8/1991 | Neuenfeldt et al. |
| 5,638,695 A | | 6/1997 | Kamio et al. |
| 5,709,100 A | * | 1/1998 | Baer et al. ................. 62/259.2 |
| 6,308,526 B1 | | 10/2001 | Esty et al. |

FOREIGN PATENT DOCUMENTS

DE  199 51 921 A1  5/2001

* cited by examiner

Primary Examiner—William C. Doerrler
(74) Attorney, Agent, or Firm—Friedrich Kueffner

(57) ABSTRACT

The air conditioning system for cupboards for receiving control and automation systems as well as for the network technique, in particular for switch cupboards with a cooling device, is characterized in that warm air (WL) is sucked from the inside (22) of the switch cupboard (20) by means of a fan (31) and is supplied to one or at least two evaporators (35, 135), preferably placed in the surface plane of the fan (31), whereby cold air (KL) is conducted into the inside (22) of the switch cupboard (20), whereby a condenser (45) is placed below the evaporators (35, 135) in such a way that the evaporators (35, 135) come to rest with a section or with their front areas (35a, 135a) above the condenser (45) so that condensate delivered by the evaporators (35, 135) drops onto the condenser (45) and evaporates or volatilizes, whereby ambient air (UL) is delivered to the condenser (45), whereby the cold air delivery sections to the inside (22) of the switch cupboard (20) are constant in their lengths or changeable in length.

13 Claims, 8 Drawing Sheets

AIR CONDITIONING SYSTEM, IN PARTICULAR FOR SWITCH CUPBOARDS

BACKGROUND OF THE INVENTION

This invention relates to an air conditioning system for cupboards for receiving control and automation systems as well for the network technique, in particular for switch cupbards, with a cooling device.

For components placed in a casing which produce waste heat correspondingly, it is necessary to dissipate the waste heat out of the casing and to control a temperature in the casing by more or less strong blowing-in of ambient air into the casing inner space by means of a ventilator. It is known that such casings are provided with a filter ventilator which either continuously runs or which is connected and disconnected by a control depending on a temperature in the casing. The filter ventilator is placed in a recess of a wall of the casing of the switch cupboard and fixed for example by means of a screwed connection. Simultaneously, corresponding air outlet slits are provided at another place of the housing for an air outlet.

Furthermore, it is known to provide switch cupboards with cooling devices which are placed on the outside or in the inside of a switch cupboard. Sucked warm air is conducted by means of this cooling device from the inside of the switch cupboard over a cooling set and the thus produced cold air is conducted again into the inside of the switch cupboard.

SUMMARY OF THE INVENTION

The aim of this invention is to create an air conditioning system with a cooling device according to the above mentioned type which can be used as a top or inside or socle air conditioning appliance, in particular in switch cupboards, whereby arising condensate is delivered to an evaporating device. Moreover, the cooling device should have the smallest dimensions and furthermore be adaptable to any switch cupboard width.

This aim is achieved by an air conditioning system with the characteristics of claim 1 and the characteristics of claim 2.

The air conditioning system according to the invention, in particular for switch cupboards, consists in that warm air is sucked from the inside of the switch cupboard by means of a fan and is supplied to one or several evaporators, preferably two, preferably in the surface plane of the fan, whereby cold air is conducted into the inside of the switch cupboard, whereby a condenser is placed below the evaporators in such a way that the evaporators come to rest with a section above the condenser so that condensate delivered by the evaporators drops onto the condenser and evaporates or volatilizes, whereby ambient air is delivered to the condenser, whereby the cold air delivery sections to the inside of the switch cupboard are changeable in length.

The cooling device according to the invention for this air conditioning system consists of an upper carrier plate, of a lower carrier plate and of a box-shaped hood type covering housing covering both carrier plates. A fan, such as for example a radial ventilator, is placed on the upper carrier plate with a central or eccentric opening and an evaporator is placed respectively on each of the two sides of the fan at a distance from each other. The lower carrier plate is provided at the center or off-center with a supply muff running into the opening in the upper carrier plate and connected with the inside of the switch cupboard for the supply of the warm air from the inside of the switch cupboard to the two evaporators. Furthermore, the lower carrier plate carries a condenser, to which a condenser fan for example an axial condenser, is associated on the back wall provided on the lower carrier plate, whereby the condenser is placed transversely to the two evaporators. Moreover, ambient air is fed to the condenser by means of the condenser fan and is carried off from this condenser fan. The upper carrier plate is placed above the lower carrier plate in such a way that the two evaporators for the condensate evaporation come to lie with their two front areas above the condenser, whereby the upper carrier plate is dimensioned with respect to the lower carrier plate in such a way that the front areas of the two evaporators are situated above the condenser. The two superimposed carrier plates are covered by means of the hood-shaped covering casing and are resting with their bottom-sided edges on the lower carrier plate. For the supply of the cold air to the inside of the switch cupboard, air passage slits are provided in the walls of the hood-shaped covering casing turned to the two evaporators or in the lower carrier plate adjacent to the front sides of the condenser. Depending on the arrangement of the cooling device, the supply of the cold air into the inside of the switch cupboard can take place directly or over supplying ducts.

Due to the arrangement and allocation of the two evaporators for evaporating in two different horizontal surface planes, not only a compact construction is obtained but also simultaneously for an evaporation of the arising condensate in that the condensate produced by the evaporators arrives directly onto the heated condenser, evaporates there or in case of high volume of condensate, there can be additionally a drainage of non evaporated condensate over an overflow or in a collecting cuvette. Since the cold air supply sections from the evaporators to the inside of the switch cupboard are changeable in length, an adaptation of the cooling device being used as a top appliance to different switch cupboard widths is possible. The technical configuration consists in that the cold air supply sections are configured as cap-shaped hoods which run into openings in the upper covering plate of the switch cupboard, whereby the cap type or hood type configured cold air supply ducts are changeable in length. The condensate discharge takes place from the evaporators situated above to the condenser, the condenser being irrigated with condensate. Due to the adaptation of the pressure ratio, a controlled condensate seal from the inner circuit is guaranteed and thus a minimization of the leakage flow from the ambience into the switch cupboard. Besides the use of the cooling device as a top appliance, the cooling device can also be placed in the inside of the switch cupboard. Then, the cooling device is preferably configured as a drawer-type subassembly so that it is possible to place one or several cooling devices in the inside of the switch cupboard, namely depending on the respective inside size, and namely at the places respectively desired between the individual components which are placed in the switch cupboard.

Preferable configurations of the invention are the subject of the subclaims.

BRIEF DESCRIPTION OF THE DRAWINGS

The air conditioning system according to the invention will be explained below with reference to a cooling device represented in the attached drawings.

DESCRIPTION OF THE PREFERRED EMBODIMENTS

Figure 1:
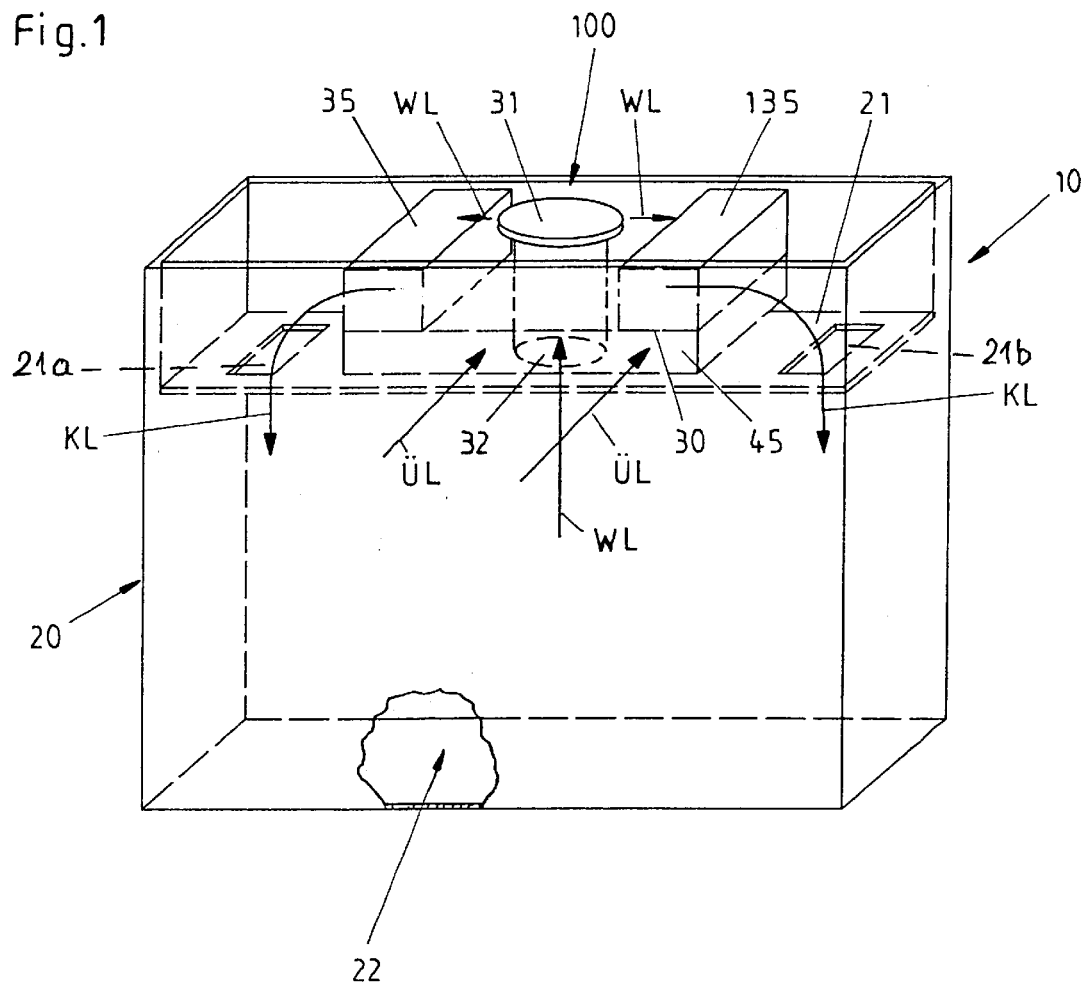
FIG. 1 shows a graphical view of the cooling device placed on a switch cupboard.

The air conditioning system according to the invention 10 comprises a cooling device 100 according to the configuration shown in FIGS. 1, 2, 3 and 4. As FIG. 1 shows, the cooling device 100 is placed on the upper covering plate 21 of a switch cupboard 20. The switch cupboard inside is indicated by 22.

The cooling device 100 consists of two carrier plates 30, 40 lying upon each other and placed at a distance from each other which are covered or encompassed by a hood shaped covering casing 50. The hood shaped covering casing 50 has approximately the shape of a box and shows, according to a preferred embodiment according to FIGS. 4 and 5, two opposed side walls 51, 52 and a front wall 53 with an opening 53a. On the top side, the hood shaped covering casing 50 is covered by means of an upper covering plate 54. The hood shaped covering casing 50 rests on the lower carrier plate 40 with its bottom sided edges/borders 55. Air passage slits 56, 56a are configured in the opposed side walls 51, 52 of the hood shaped covering casing 50. The back wall of the hood shaped covering casing 50 is formed by a back wall 40a provided on the lower carrier plate 40 so that a closed box type casing is obtained which receives the cooling device 100.

Figure 4:
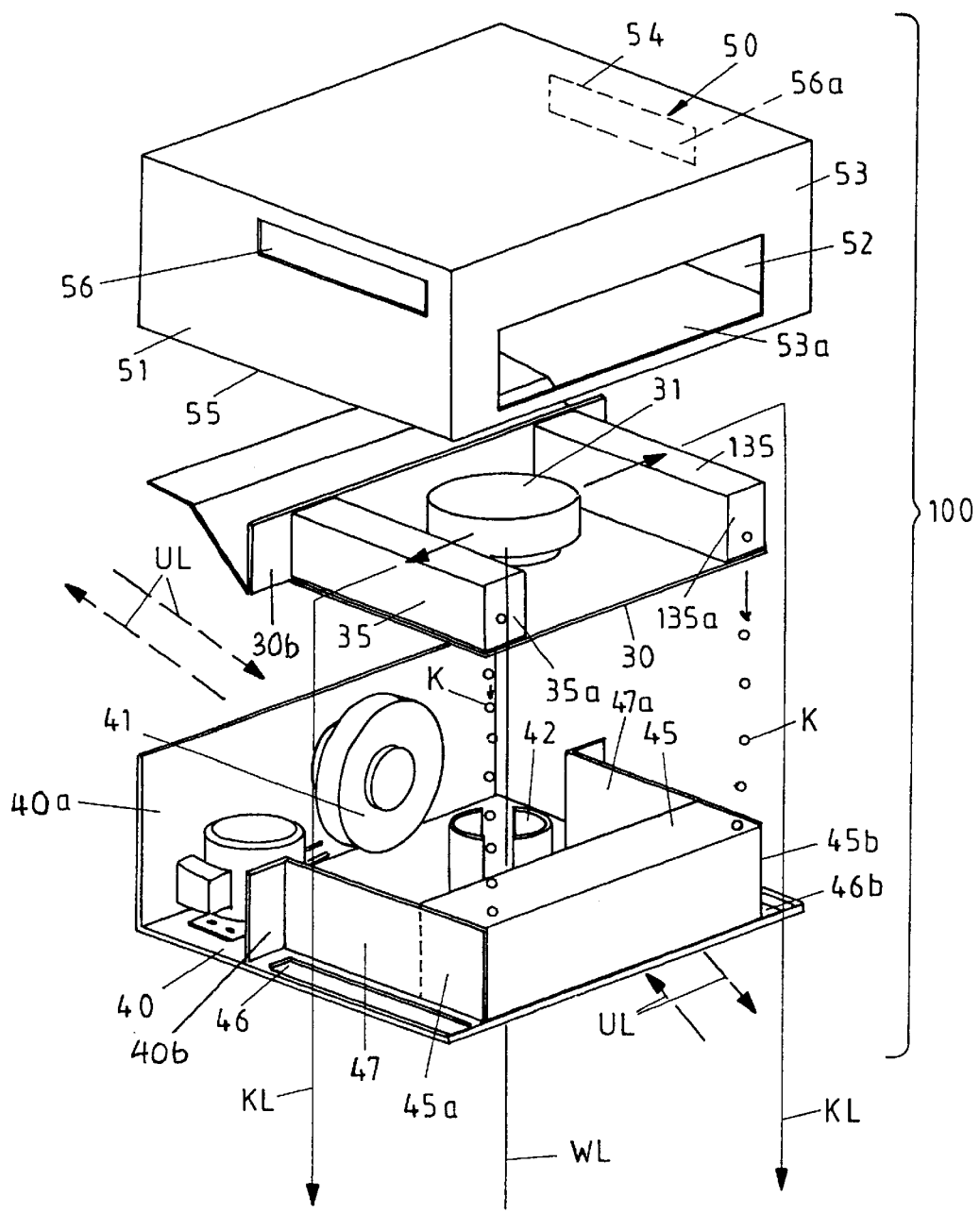
FIG. 4 shows a graphical exploded representation of the cooling device with the evaporators and the carrier plates carrying the condensers.
Figure 5:
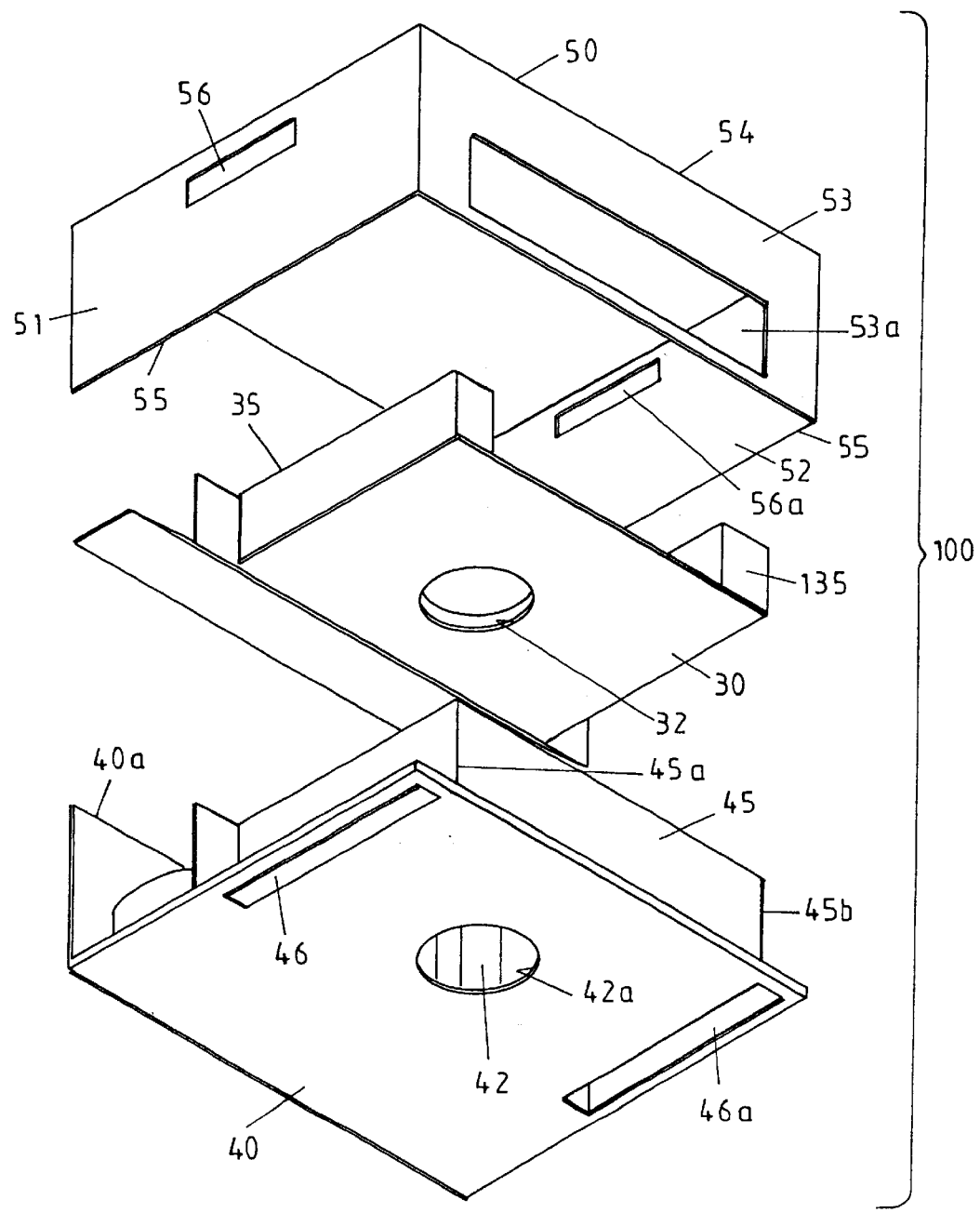
FIG. 5 shows a graphical exploded representation of the cooling device from above.
Figure 8:
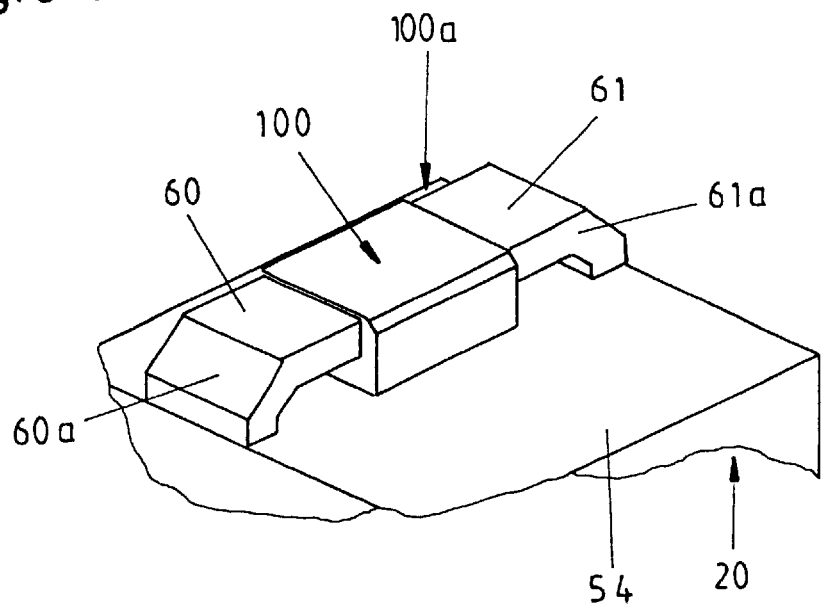
FIGS. 8A and 8B show graphical views of cooling devices placed on the top of switch cupboards with hood type cold air supply ducts in different sizes.
Figure 8:
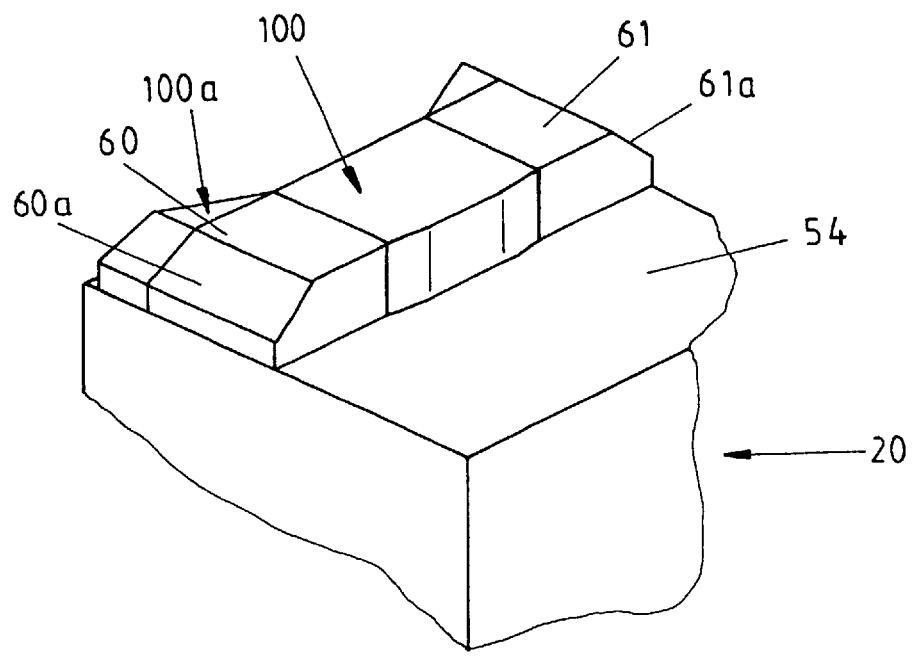

The upper carrier plate 30 is provided with a central opening 32 which can also be placed off-center (FIGS. 1, 4 and 5). A fan 31, such as for example a radial fan, is placed on the upper carrier plate 30 in the area of this opening 32. An evaporator 35, 135 is placed respectively on both sides of the fan 31 at a distance from each other on the upper carrier plate 30, the warm air WL being supplied from the inside 22 of the switch cupboard 20 by means of the fan 31. The number of the evaporators 35, 135 placed on the upper carrier plate 30 is not limited to two evaporators. It is also possible to use only one single evaporator or to place several evaporators in groups on both sides of the fan 31 (FIG. 1). The air passage slits 56, 56a in the side walls 51, 52 of the hood shaped covering casing 50 are provided in the area of the two evaporators 35, 135 so that the cold air KL can directly come from the evaporators 35, 135 and pass through the air passage slits 56, 56a in order to be supplied to the inside 22 of the switch cupboard 20 (FIGS. 8A, 8B). The supply of the cold air KL from the two evaporators 35, 135 in the inside 22 of the switch cupboard 20 takes place over slit-shaped openings or apertures 21a, 21b provided in the upper covering plate 21 of the switch cupboard 20 (FIG. 1).

The invention is described below as an embodiment with a cooling device 100 with two evaporators 35, 135.

The lower carrier plate 40 is provided at the center or off-center with an opening 42a into which a vertically directed supply muff 42 runs (FIGS. 4 and 5). This supply muff 42 runs with its free end into the opening 32 in the upper carrier plate 30 so that the inside 22 of the switch cupboard 20 is connected over the supply muff 42 with the inside which is limited or formed by the upper carrier plate 30 with its both evaporators 35, 135 so that the warm air WL is supplied into the suction area of the evaporator fan 31 and over this fan to the two evaporators 35, 135. The warm air WL from the inside 22 of the switch cupboard 20 is sucked by means of the fan 31 and supplied to the two evaporators 35, 135.

Figure 2:
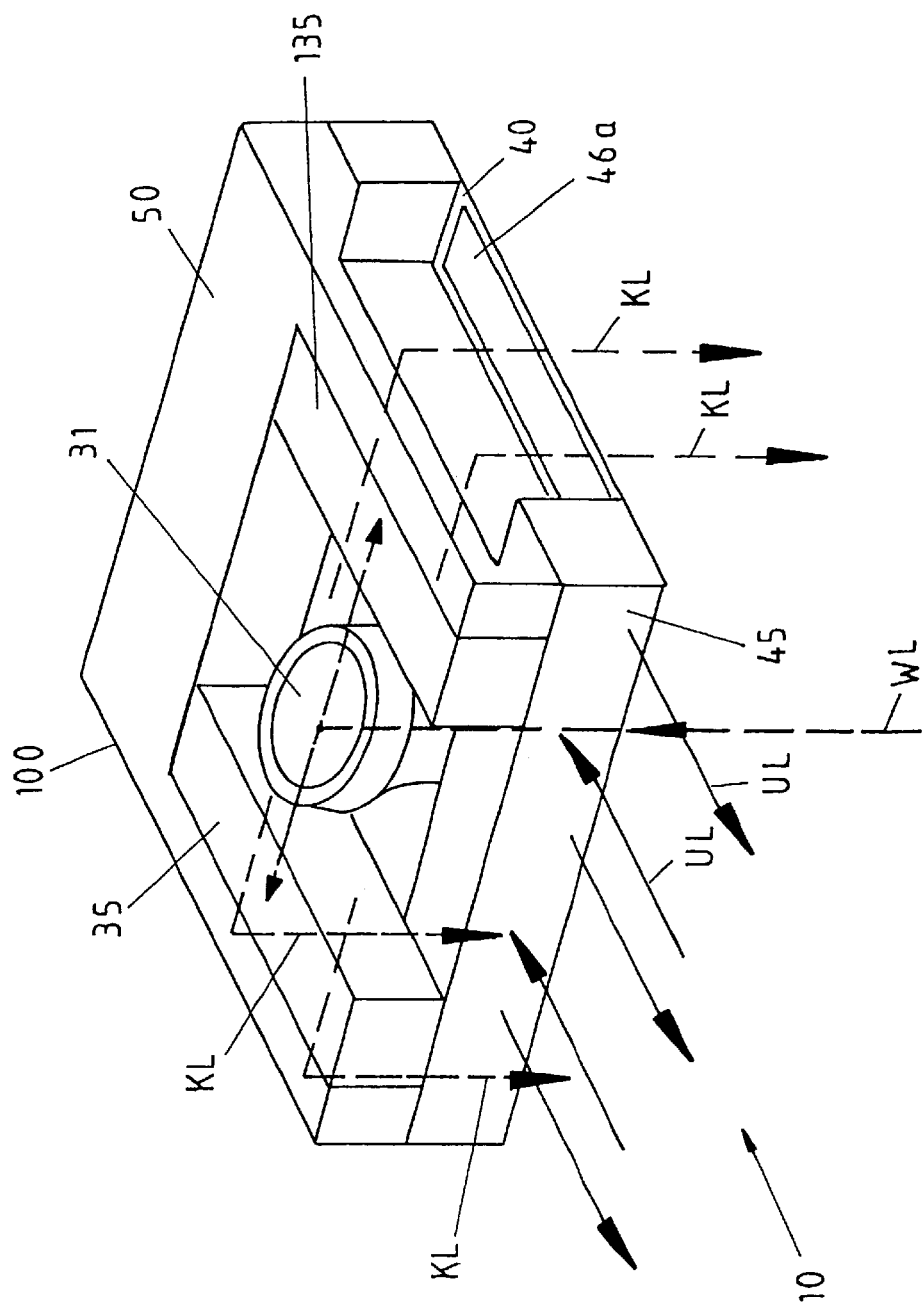
FIG. 2 shows a graphical view of the cooling device with the different airflows.

Moreover, the lower carrier plate 40 carries a condenser 45 which is connected with a condenser fan 31 which is configured for example as an axial fan so that ambient air UL is supplied to the condenser 45 by means of the condenser fan 41 and is carried off again from this condenser fan. The flow of the ambient air UL supplied to the condenser 45 is indicated in FIGS. 1 and 2 with arrows. The condenser fan 41 is placed in the back wall 40a of the lower carrier plate 40 (FIG. 4). Thus, it is possible to suck ambient air UL from behind or to blow it off to the back side (condenser circuit).

The condenser 45 on the lower carrier plate 40 is placed transversely to the two evaporators 35, 135 on the upper carrier plate.

Figure 3:
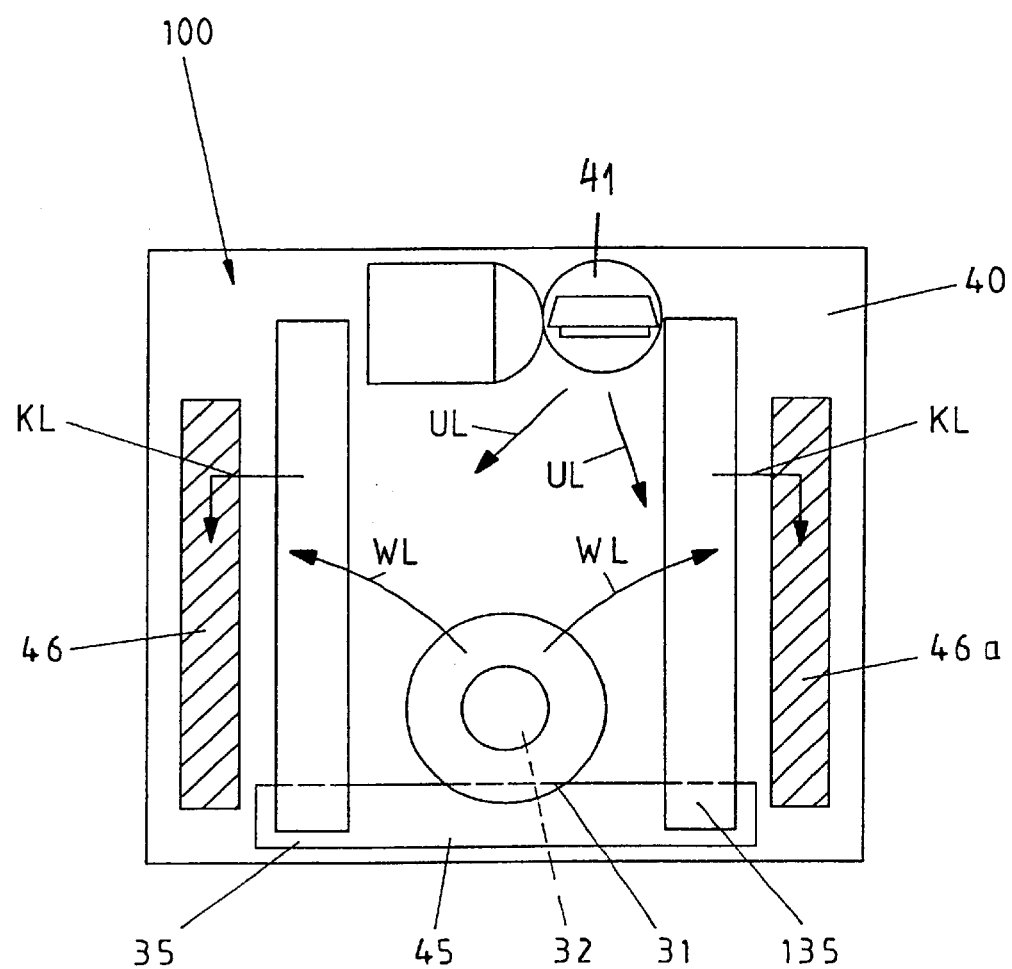
FIG. 3 shows a topview onto the cooling device.

As FIGS. 4 and 5 in particular show, the upper carrier plate 30 is placed above the lower carrier plate 40 in such a way that the two evaporators 35, 135 for the condensate evaporation come to rest with their two front areas 35a, 135a above the condenser 45. The upper carrier plate 30 is preferably dimensioned with respect to the lower carrier plate 40 in such a way that the front areas 35a, 135a of the two evaporators 35, 135 rest above the condenser 45 (FIGS. 2 and 3).

The supply of the cold air KL from the two evaporators 35, 135 to the inside 22 of the switch cupboard 20 takes place, for the embodiment shown in FIG. 1, over air passage slits 56, 56a in the walls 51, 52 of the hood shaped covering casing 50 turned to the two evaporators 35, 135.

A further embodiment according to FIG. 4 provides that the cold air KL is fed to the inside 22 of the switch cupboard 20 over air passage slits 46, 46a provided in the lower carrier plate 40 in the vicinity of the front areas 45a, 45b of the condenser 45. The configuration of the air passage slits 46, 46a in the lower carrier plate 40 is so that the condenser 45 has a small length with respect to the length of the lower carrier plate 40 so that plate sections are constituted in which the air passage slits 46, 46a can be provided. As FIG. 4 shows, lateral walls 47, 47a are provided in the area of the air passage slits 46, 46a on the lower carrier plate 40, these walls constituting with the condenser 45 placed in the front area an inner space which is covered by the upper carrier plate 30 placed on the lower carrier plate. The cooling device 100 is then placed on the upper covering plate 21 of the switch cupboard 20 in such a way that the air passage slits 56, 56a in the lower carrier plate 40 correspond with corresponding openings or apertures 21a, 21b in the upper covering plate 21 of the switch cupboard 20.

Figure 6:
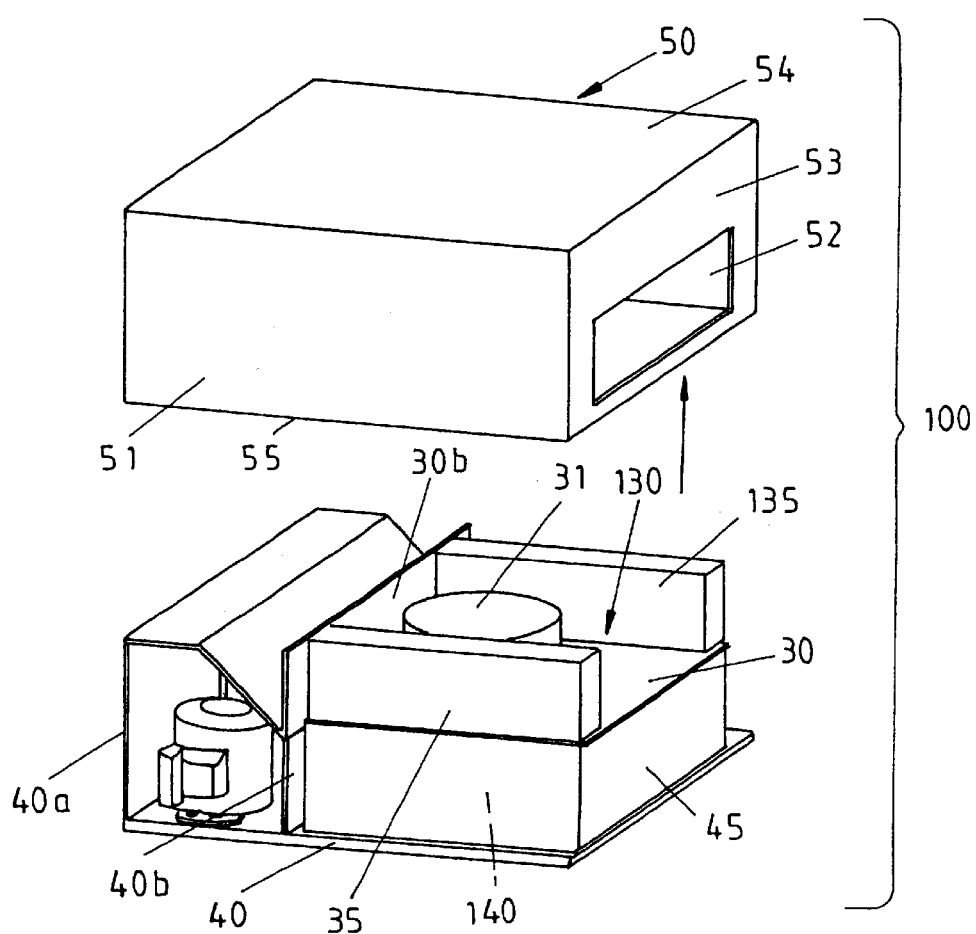
FIG. 6 shows a graphical exploded representation of the cooling device with a lifted hood type covering casing in a lateral view.
Figure 7:
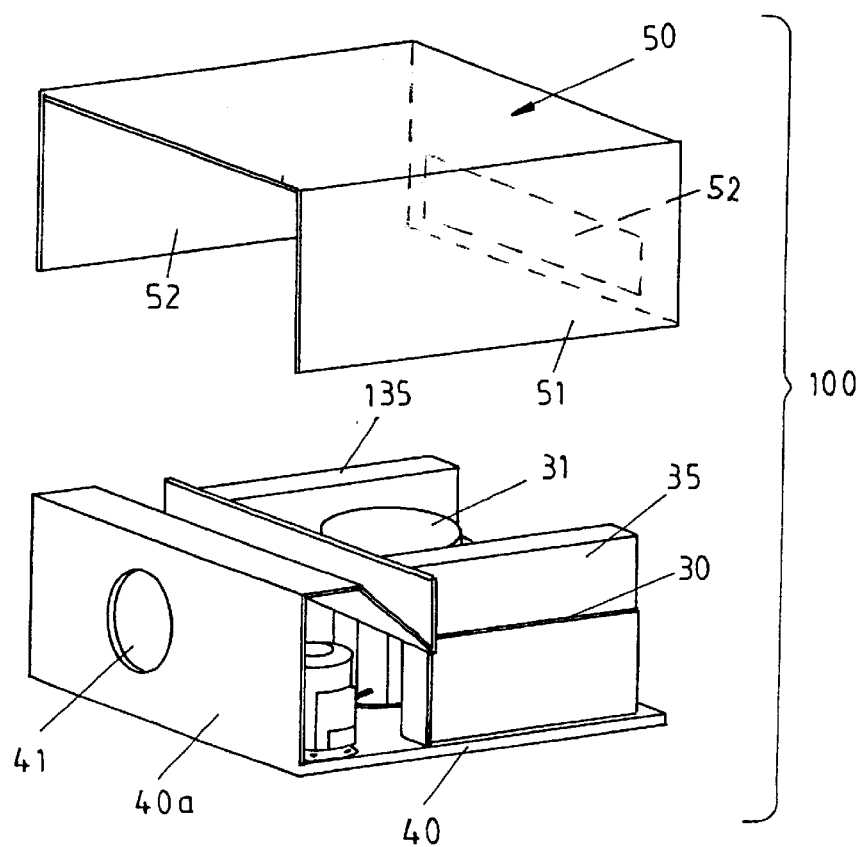
FIG. 7 shows a graphical exploded representation of the cooling device with a lifted hood type covering casing in a back view.

The hood shaped covering casing 50 laps over the two superimposed carrier plates 30, 40 in such a way that the opening 53a in the front wall 53 of the hood shaped covering casing 50 lies in the area of the condenser 45 so that ambient air UL can be supplied to the condenser 45 (FIG. 6).

Preferably, approximately the same pressure ratio is maintained in the chamber 130 formed by the upper carrier plate 30 and the chamber 140 formed by the lower carrier plate 40. This takes place over the appropriate control of the fan 31 and of the condenser fan 41. According to a further configuration, a condensate collecting cuvette with a channel, which is not represented in the drawing, is provided on the bottom of the condenser 45. The condensate of the two evaporators 35, 135 is collected and directed to the front onto the condenser 45 where it can evaporate. An adaptation of the pressure ratio in the evaporator and condenser space takes place.

The chamber 130 on the upper carrier plate 30 is formed by the two evaporators 35, 135, the upper section 53*b*, the front wall 53 of the hood shaped covering casing 50 and a back wall 30*b* placed at the back on the carrier plate 30. The chamber 140 on the lower carrier plate 40 is formed by the front condenser 45, the lateral side walls 47, 47*a* connected with the carrier plate 40 and the carrier plate back wall 40*a* or an intermediate wall 40*b* (FIGS. 4 and 6), whereas the carrier plate back wall 40*a* extends over both chambers 130, 140, i.e. the height of the carrier plate back wall 40*a* corresponds to the height of the two superimposed chambers 130, 140.

The cooling device 100 is configured as a top appliance 100*a*, as represented in FIGS. 1, 8*a* and 8*b*, whereby the upper covering plate 21 of the switch cupboard 20 is provided with a corresponding number of openings for the connection of the warm air supply muffs 42 and for the cold air supply to the inside 22 of the switch cupboard 20.

As FIGS. 8*a* and 8*b* show, the openings or air passage slits 56, 56*a* for the cold air KL provided in the opposed side walls 51, 52 of the hood shaped covering casing 50 for the two carrier plates 30, 40 are provided with lateral cap shaped cold air supply ducts 60, 60*a* placed on the covering casing 50 which have, at their ends, U-bent duct sections 60*a*, 61*a* which run into openings in the upper covering plate 21 of the switch cupboard. These cold air supply ducts 60, 61 are configured changeable in length so that an adaptation to any switch cupboard width is possible.

According to the invention and with reference to FIG. 4, the air conditioning system in connection with the cooling device 100 is configured in such a way that warm air WL is sucked from the inside 22 of the switch cupboard 20 by means of the fan 31 and is supplied to at least two evaporators 35, 135, preferably lying in the surface plane of the fan 31. Cold air KL is directed by these evaporators 35, 135 into the inside 22 of the switch cupboard 20. The condenser 45 is placed below the evaporators 35, 135 in such a way that the evaporators 35, 135 come to rest with a section or with their front areas 35*a*, 135*a* above the condenser so that condensate K delivered by the evaporators 35, 135 drops onto the condenser 45 and evaporates or volatilizes. Ambient air UL is supplied to the condenser 45, whereby the cold air supply ducts to the inside 22 of the switch cupboard 20 are changeable in length. The conduction of the warm air WL, of the cold air KL, of the ambient air UL and of the condensate K is indicated by arrows in FIG. 4.

The air conditioning system according to the invention with its cooling device 100 can be used everywhere where the heat is carried off from an inside space in which heat is produced by components and where cold air must be supplied.

The cooling device 100 is placed in the inside of the switch cupboard 20, can be used as a top appliance on a switch cupboard, as a rack appliance in the inside of a switch cupboard 20 and as a socle appliance; preferably, the cooling device 100 has a flat construction.

What is claimed is:

1. Air conditioning system for cupboards for receiving control and automation systems as well as for the network technique, in particular for switch cupboards with a cooling device, wherein warm air (WL) is sucked from the inside (22) of the switch cupboard (20) by means of a fan (31) and is supplied to two evaporators (35, 135) arranged in the surface plane of the fan (31), whereby cold air (KL) is conducted into the inside (22) of the switch cupboard (20), whereby a condenser (45) is placed below the evaporators (35, 135) in such a way that the evaporators (35, 135) come to rest only with their front areas (35*a*, 135*a*) above the condenser (45) so that condensate delivered by the evaporators (35, 135) drops onto the condenser (45) and evaporates or volatilizes, whereby ambient air (UL) is delivered to the condenser (45), whereby the cold air delivery sections to the inside (22) of the switch cupboard (20) are constant in their lengths or changeable in length, the evaporators being arranged at a distance from one another and at a right angle to the condenser.

2. Air conditioning system for cupboards for receiving control and automation systems as well for the network technique, in particular for switch cupboards with a cooling device, wherein warm air (WL) is sucked from the inside (22) of the switch cupboard (20) by means of a fan (31) and is supplied to one or several evaporators (35, 135), preferably two, preferably in the surface plane of the fan (31), whereby cold air (KL) is conducted into the inside (22) of the switch cupboard (20), whereby a condenser (45) is placed below the evaporators (35, 135) in such a way that the evaporators (35, 135) come to rest with a section or with their front areas (35*a*, 135*a*) above the condenser (45) so that condensate delivered by the evaporators (35, 135) drops onto the condenser (45) and evaporates or volatilizes, whereby ambient air (UL) is delivered to the condenser (45), whereby the cold air delivery sections to the inside (22) of the switch cupboard (20) are constant in their lengths or changeable in length, wherein the cooling device (100) consists of an upper carrier plate (30), of a lower carrier plate (40) and of a box-shaped hood type covering housing (50) covering the upper and the lower carrier plates (30, 40), a fan (31), such as for example a radial ventilator, is placed on the upper carrier plate (30) with a central or eccentric opening (32) in the area of the opening (32) and an evaporator (35, 135) is placed respectively on each of the two sides of the fan (31) at a distance from each other, the lower carrier plate (40) is provided at the center or off-center with an air supply muff (42) running into the opening (32) in the upper carrier plate (30) and connected with the inside (22) of the switch cupboard (20) for the supply of the warm air (WL) from the inside (22) of the switch cupboard (20) to the two evaporators (35, 135) and carries a condenser (45), to which a condenser fan (41), for example an axial condenser, is associated on the back wall (40*a*) provided on the lower carrier plate (40), whereby the condenser is placed transversely to the two evaporators (35, 135) and to which ambient air (UL) is supplied and carried off by means of the condenser fan (41), that the upper carrier plate (30) is placed above the lower carrier plate (40) in such a way that the two evaporators (35, 135) for the condensate evaporation come to lie with their two front areas (35*a*, 135*a*) above the condenser (45), whereby the upper carrier plate (30) is dimensioned with respect to the lower carrier plate (40) in such a way that the front areas (35a, 135a) of the two evaporators (35, 135) are situated above the condenser (45),the evaporators being arranged at a distance from one another and at a right angle to the condenser, the two superimposed carrier plates (30, 40) are covered by means of the hood-shaped covering casing (50) which rests with their bottom-sided edges (55) on the lower carrier plate (40) and that for the supply of the cold air (KL) to the inside (22) of the switch cupboard (20)
 a.) air passage slits (56, 56a) are provided in the walls (51, 52) of the hood-shaped covering casing (50) turned to the two evaporators (35, 135) or
 b.) air passage slits (46, 46a) are provided in the lower carrier plate (40) adjacent to the front sides (45a, 45b) of the condenser (45).

3. Air conditioning system according to claim 2, wherein approximately the same pressure ratio is maintained in the chamber (130) formed by the upper carrier plate (30) and the chamber (140) formed by the lower carrier plate (40) in connection with the hood shaped covering casing (50).

4. Air conditioning system according to claim 2, wherein the chamber (130) on the upper carrier plate (30) is formed by the two evaporators (35, 135), the upper section (53b), the front wall (53) of the hood shaped covering casing (50) and a back wall (30b) placed at the back on the upper carrier plate (30) and the chamber (140) on the lower carrier plate (40) is formed by the front condenser (45), the lateral side walls (47, 47a) connected with the lower carrier plate (40) and the carrier plate back wall (40a) or an intermediate wall 40b, whereby the carrier plate back wall (40a) extends over both chambers (130, 140) so that the height of the carrier plate back wall (40a) corresponds to the height of the two superimposed chambers (130, 140).

5. Air conditioning system according to claim 2, wherein the air passage slits (56, 56a) in the side walls (51, 52) of the hood shaped covering casing (50) are provided in the area of the two evaporators (35, 135) in such a way that the cold air (KL) flows directly from the evaporators (35, 135) through the air passage slits (56, 56a) to be supplied to the inside (22) of the switch cupboard (20).

6. Air conditioning system according to claim 2, wherein the cold air (KL) flows from the two evaporators (35, 135) into the inside (22) of the switch cupboard (20) over slit shaped openings or apertures (21a, 21b) provided in the upper covering plate (21) of the switch cupboard (20).

7. Air conditioning system according to claim 1, wherein the cooling device (100) has a condensate collecting cuvette with a channel at the bottom of the condenser (45).

8. Air conditioning system according to claim 2, wherein the condensate of the two evaporators (35, 135) is collected and directed to the front onto the condenser (45).

9. Air conditioning system according to claim 1, wherein the cooling device (100) is configured as a top appliance (100a), whereby the upper covering plate (21) of the switch cupboard casing (20) is provided with openings for the connection of the warm air supply muff (42) and for the cold air supply to the inside (22) of the switch cupboard (20).

10. Air conditioning system for cupboards for receiving control and automation systems as well for the network technique, in particular for switch cupboards with a cooling device, wherein warm air (WL) is sucked from the inside (22) of the switch cupboard (20) by means of a fan (31) and is supplied to one or several evaporators (35, 135), preferably two, preferably in the surface plane of the fan (31), whereby cold air (KL) is conducted into the inside (22) of the switch cupboard (20), whereby a condenser (45) is placed below the evaporators (35, 135) in such a way that the evaporators (35, 135) come to rest with a section or with their front areas (35a, 135a) above the condenser (45) so that condensate delivered by the evaporators (35, 135) drops onto the condenser (45) and evaporates or volatilizes, whereby ambient air (UL) is delivered to the condenser (45), whereby the cold air delivery sections to the inside (22) of the switch cupboard (20) are constant in their lengths or changeable in length, wherein the cooling device (100) is configured as a top appliance (100a), whereby the upper covering plate (21) of the switch cupboard casing (20) is provided with openings for the connection of the warm air supply muff (42) and for the cold air supply to the inside (22) of the switch cupboard (20), wherein the outlet openings (56, 56a) provided in the opposed side walls (51, 52) of the hood shaped covering casing (50) for the two carrier plates (30, 40) for the cold air (KL) are provided with lateral hood shaped cold air supply ducts (60, 61) placed on the covering housing (50), these supply ducts having at their ends U-bent duct sections (60a, 61a) which run into openings in the upper covering plate (21) of the switch cupboard casing (20).

11. Air conditioning system according to claim 10, wherein the cold air supply ducts (60, 61) are changeable in their lengths.

12. Air conditioning system according to claim 1, wherein the cooling device (100) is configured as a rack appliance and is placed in the inside (22) of the switch cupboard (20).

13. Air conditioning system according to claim 1, wherein the cooling device (100) is configured as a top appliance and is placed on the lower covering plate (21) of the switch cupboard (20).

* * * * *